(12) United States Patent
Hisatsugu

(10) Patent No.: US 8,866,537 B2
(45) Date of Patent: Oct. 21, 2014

(54) INPUT APPARATUS

(71) Applicant: Denso Corporation, Kariya (JP)

(72) Inventor: Shinsuke Hisatsugu, Kariya (JP)

(73) Assignee: Denso Corporation, Kariya (JP)

( * ) Notice: Subject to any disclaimer, the term of this patent is extended or adjusted under 35 U.S.C. 154(b) by 151 days.

(21) Appl. No.: 13/735,318

(22) Filed: Jan. 7, 2013

(65) Prior Publication Data

US 2013/0175148 A1    Jul. 11, 2013

(30) Foreign Application Priority Data

Jan. 10, 2012  (JP) ................................. 2012-002380

(51) Int. Cl.
*H03K 17/96* (2006.01)
*H01H 59/00* (2006.01)

(52) U.S. Cl.
CPC ... *H01H 59/00* (2013.01); *H03K 2217/960755* (2013.01); *H03K 2217/960705* (2013.01); *H03K 17/9622* (2013.01)
USPC .......................................... 327/517; 327/565

(58) Field of Classification Search
USPC .................. 327/516, 517, 564, 565
See application file for complete search history.

(56) References Cited

U.S. PATENT DOCUMENTS

| 8,248,149 | B2 * | 8/2012 | Beck ............................. 327/517 |
| 8,575,995 | B2 * | 11/2013 | Shigetaka ..................... 327/517 |
| 2013/0175148 | A1 | 1/2013 | Kim et al. |
| 2013/0194029 | A1 | 8/2013 | Hisatsugu |

FOREIGN PATENT DOCUMENTS

| JP | 63-054619 | 3/1988 |
| JP | 2008-141329 | 6/2008 |
| JP | 2009-295365 | 12/2009 |
| JP | 2010-086385 | 4/2010 |

OTHER PUBLICATIONS

Office action dated Mar 28, 2014 in corresponding U.S. Appl. No. 13/746,620.

* cited by examiner

*Primary Examiner* — Hai L Nguyen
(74) *Attorney, Agent, or Firm* — Harness, Dickey & Pierce, PLC

(57) ABSTRACT

An input apparatus includes a touch plate, a film sensor, an electrode portion, and a wire portion. The touch plate has a front side touched by the finger in the finger manipulation. The film sensor is bonded to a rear side of the touch plate. The electrode portion and wire portion are provided on the film sensor and connected to each other. The touch plate is composed of a plurality of different members including at least a first member and a second member. The plurality of different members have respective dielectric constants and being layered and laminated, respectively, in a plate thickness direction of the touch plate. The plurality of different members have different dimension ratios in the plate thickness direction to provide different dielectric constants depending on the electrode portion and the wire portion and provide a uniform plate thickness over a whole of the touch plate.

3 Claims, 1 Drawing Sheet

INPUT APPARATUS

CROSS REFERENCE TO RELATED APPLICATION

The present application is based on Japanese Patent Application No. 2012-2380 filed on Jan. 10, 2012, the disclosure of which is incorporated herein by reference.

TECHNICAL FIELD

The present disclosure relates to an input apparatus which inputs an operating condition to a predetermined apparatus by a variation of an electrostatic capacity generated between a finger of a user and an electrode in response to a movement of the finger.

BACKGROUND

Patent document 1: JP 2010-86385 A

Patent document 1 describes a conventional input apparatus, which generates a capacitor in between an electrode and a finger of a user serving as an electric conductive manipulator to detect a change of an electrostatic capacity in the capacitor, thereby enabling an intended input. The input apparatus includes a touch plate, i.e., touch panel; a film sensor, i.e., dielectric film, facing the touch plate; several electrodes on a touch-panel side of the film sensor; and a wiring line having one terminal end connected with the electrode and the other terminal end connected with a circuit board, transmitting detection signals. The film sensor receives an insulating foaming layer over the touch-panel side to cover the wiring line. Alternatively, instead of the foaming layer, a spacer is provided to intervene between the touch plate and the film sensor, forming air space.

A finger may approach a region, which is over the touch panel and opposite the wiring line, unintentionally. Even in such a case, the above configuration of the foaming layer or air space help prevent the capacitor between the wiring line and the finger from arising, or the electrostatic capacity from changing. This may preclude a mis-manipulation or malfunction.

In the above input apparatus, the foaming layer on the film sensor or the air space due to the spacer produces a level difference on the film sensor, decreasing an area for bonding the touch plate and film sensor, thereby possibly causing peeling therebetween.

As the distance between the electrodes, which form the capacitor, increases, the electrostatic capacity generated between the electrodes decreases. Thus, the sensitivity to the wiring line may be adjusted by increasing the plate thickness of the touch plate corresponding to the wiring line. This may, however, make the plate thickness of the touch plate uneven all over the touch plate, producing wrinkles or tensional loads in the film sensor when bonding with the touch plate. This may cause a decline in the sensitivity or durability.

SUMMARY

It is an object of the present disclosure to provide an input apparatus, which facilitates sensitivity adjustment relative to a wire portion and helps prevent a mis-manipulation or malfunction due to the wire portion while improving bonding between a touch plate and a film sensor.

To achieve the above object, according to a first example of the present disclosure, an input apparatus is provided as follows. The input apparatus inputs an operating condition to a predetermined apparatus by using an electrostatic capacity based on a finger manipulation of a finger of a user. The input apparatus includes a touch plate, a film sensor, an electrode portion, and a wire portion. The touch plate has a front side touched by the finger in the finger manipulation. The film sensor is bonded to a rear side of the touch plate. The electrode portion is provided on the film sensor. The wire portion is provided on the film sensor and connected to the electrode portion to transmit a signal outputted from the electrode portion. The touch plate is composed of a plurality of different members including at least a first member and a second member. The plurality of different members have respective dielectric constants and are layered and laminated, respectively, in a plate thickness direction of the touch plate. The plurality of different members have different dimension ratios in the plate thickness direction to provide different dielectric constants depending on the electrode portion and the wire portion and provide a uniform plate thickness over a whole of the touch plate.

The use of two or more different members (e.g., different types of materials, different materials) differentiates the dielectric constant corresponding to the electrode portion and the dielectric constant corresponding to the wire portion therebetween. This permits the portion of the touch plate corresponding to the electrode portion to have a dielectric constant necessary for a secured input through finger manipulation. In contrast, the portion of the touch plate corresponding to the wire portion is permitted to have a dielectric constant reducing sensitivity, helping prevent a mis-manipulation or malfunction related with the wire portion.

The touch plate has two or more different members, but is provided to have a uniform plate thickness over the whole of the touch plate. This permits the rear side of the touch plate to have a flat surface that the film sensor bonds. The film sensor may therefore undergo less wrinkles or tensional loads. In addition, the flat surface of the rear side of the touch plate may secure an area for bonding with the film sensor maximally, enhancing the bonding strength. The uniform plate thickness over the whole of the touch plate may preclude deformation or concavity on and over the touch plate when shape forming of the touch plate, and secure a strength by suppressing stress concentration in the finger manipulation on the touch plate.

In addition, the dielectric constant varies by changing the dimension ratios in the plate thickness direction of each of two or more different members layered and laminated. This facilitates the setup of the dielectric constant according to each of the electrode portion and the wire portion. In contrast, the touch plate composed of a single member may need to increase a plate thickness for setting up the dielectric constant. Thus, unlike the touch plate having the single member, the touch panel of two or more different members does not need to increase a plate thickness and a size of the input apparatus.

In addition, the touch plate composed of two or more different members may adjust transmission or non-transmission of lights to provide an external appearance or view such that a necessary portion is transparent and bright whereas an unnecessary portion is smoked and less-visible, thereby giving the input apparatus an added value.

According to a second example of the present disclosure, an input apparatus is provided to input an operating condition to a predetermined apparatus by varying an electrostatic capacity in response to a finger manipulation of a finger of a user. The input apparatus includes a touch plate, a film sensor, an electrode portion, and a wire portion. The touch plate has a front side contacted by the finger in the finger manipulation. The film sensor is bonded to a rear side of the touch plate. The electrode portion is provided on the film sensor. The wire portion is provided on the film sensor and connected to the electrode portion to transmit a signal outputted from the electrode portion. The touch plate is composed of a plurality of different members including at least two different members. The plurality of different members have respective dielectric constants and being layered and laminated, respectively, in a plate thickness direction of the touch plate. The plurality of different members have different dimension ratios in the plate thickness direction, providing different dielectric constants to differentiate in sensitivity between (i) a portion of the touch plate corresponding to the electrode portion and (ii) a portion of the touch plate corresponding to the wire portion.

BRIEF DESCRIPTION OF THE DRAWINGS

The above and other objects, features, and advantages of the present disclosure will become more apparent from the following detailed description made with reference to the accompanying drawings. In the drawings.

DETAILED DESCRIPTION

The following will explain several embodiments with reference to the drawings. Each embodiment may have a portion corresponding to that of a precedent embodiment; such a portion is assigned with an identical reference number so as to omit overlapped explanation. When only a portion of the configuration of each embodiment is explained, the other portions of the configuration may adopt those of the precedent embodiment previously explained. Partial combination between the embodiments may be possible with respect to not only a portion which is explicitly described in each embodiment, but also a portion which is not explicitly described if any trouble does not arise.

First Embodiment

Figure 1:
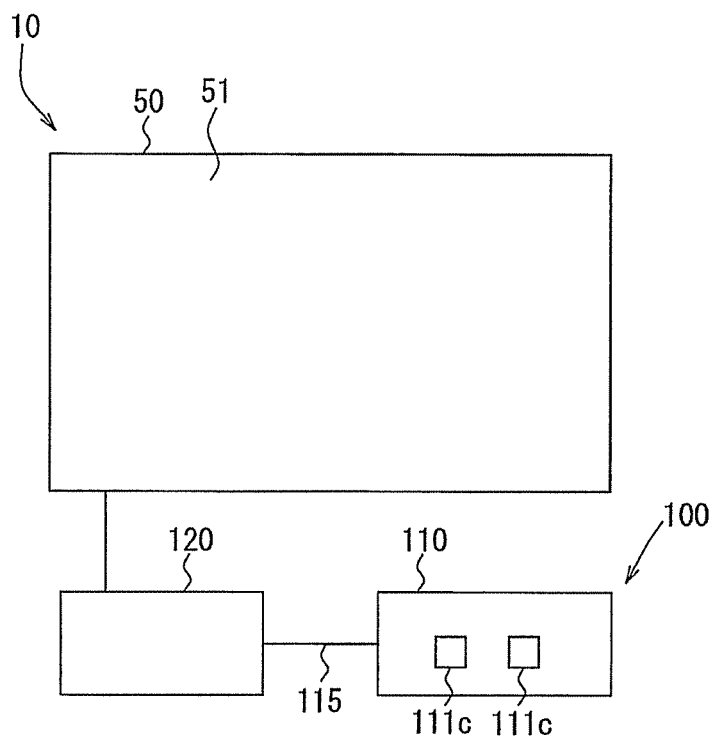
FIG. 1 is a block diagram illustrating an overall configuration of a navigation system according to an embodiment of the present disclosure.
Figure 2:
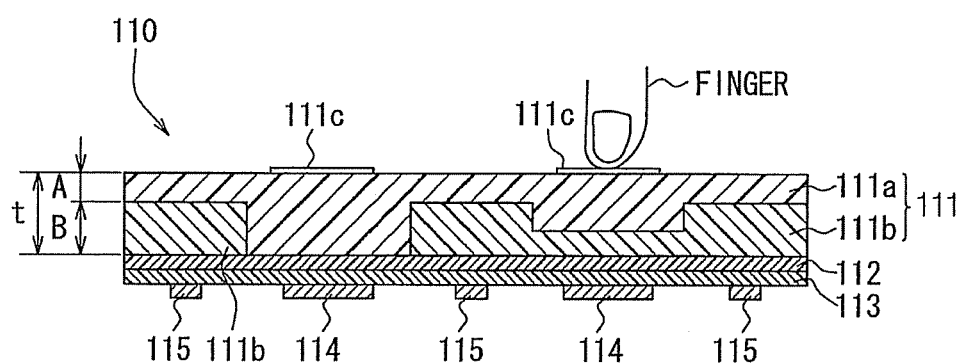
FIG. 2 is a sectional view illustrating an input portion.

With reference to FIGS. 1, 2, the following will explain a navigation system 10 as an example of a vehicular input manipulation/display system having an input apparatus 100 according to an embodiment of the present disclosure. The vehicular input manipulation/display system may include, in addition to the navigation system 10, an audio system, an air-conditioning system, and another in-vehicle system.

The navigation system 10 in a vehicle includes a display apparatus 50 and an input apparatus 100, two of which connect with each other via signal lines. The display apparatus 50 displays (i) a present position and heading direction of the vehicle on a map and (ii) route guidance information to reach an intended destination.

The display apparatus 50 may display selectively a variety of information or windows on a screen 51. The display apparatus 50 is disposed, for instance, in an area above a central position of an instrument panel for a user or driver of the vehicle to easily see. The display apparatus 50 includes a liquid crystal display, and an organic electroluminescence display. The displayed information of the display apparatus 50 includes map information related to route guidance, vehicle present position information, destination retrieval information, guidance information using characters.

The input apparatus 100 uses an electrostatic capacity and includes an input portion 110 and a control circuit 120. The input portion 110 is an input device or means to input an operating condition (i.e., what is displayed?) for the display apparatus 50 through a driver's finger manipulation or control. In specific, the user performs an input manipulation or finger manipulation to display intended information in the display apparatus 50. The input portion 110 is disposed near a shift lever in between the driver's seat and the passenger seat, for example. The input portion 110 includes a touch plate 111, a double-stick tape 112, a film sensor 113, electrode portions 114, and wire portions 115, as illustrated in FIG. 2.

The touch plate 111 is composed of a resin material and serves as an input manipulation portion and an appearance design portion, for example. The present embodiment has a feature provided to a configuration of this touch plate 111, to be mentioned later.

The film sensor 113 is a thin film member to have an outline shape responding to the shape of the input operation portion and appearance design portion on the touch plate 111. The film sensor 113 is formed of polyethylene terephthalate, or polyimide, for example. The film sensor 113 is disposed or laminated on a rear side of the touch plate 111 (i.e., under the touch plate 111 in FIG. 2). The double-stick tape 112 (i.e., adhesive) is provided in between the touch plate 111 and the film sensor 113 to serve as a bonding member to bond the film sensor 113 and the touch plate 111.

The electrode portion 114 forms a capacitor together with a finger of the user during the finger manipulation via the touch plate 111 and the film sensor 113. For example, the electrode portion 114 is formed of a printing member containing a metallic thin film and/or a conductive substance such as carbon, silver, nanowire, or conductive polymer. The electrode portion 114 is formed on and bonded to the film sensor 113 or either front side or rear side of the film sensor 113 (i.e., under or over the film sensor 113 in FIG. 2). The number of electrode portions 114 is determined based on the number of display inputs to the display apparatus 50. The present embodiment has two electrode portions 114, for example.

The wire portion 115 transmits signals, which are related to electrostatic capacities and outputted from the electrode portion 114. One terminal end of the wire portion 115 connects with the electrode portion 114, and the other connects to the control circuit 120. The number of wire portions 115 is the same as that of the electrode portions 114 to configure pairs. Like the electrode portion 114, the wire portion 115 is formed of a printing member containing a metallic thin film and/or a conductive substance such as carbon, silver, nanowire, or conductive polymer; the wire portion 115 is formed on and bonded to the film sensor 113 or either front side or rear side of the film sensor 113 (i.e., under or over the film sensor 113 in FIG. 2).

The control circuit 120 controls display states of necessary information in the display apparatus 50 when the navigation system 10 performs route guidance. The control circuit 120 further changes selectively a variety of display information based on the finger manipulation by the user to the input portion 110.

With reference to FIG. 2, the following will explain a configuration of the touch plate 111.

The touch plate 111 is a flat plate having a uniform plate thickness t over the whole of the touch plate 111 and formed of resin material. The touch plate 111 is composed of two different members having respective dielectric constants (i.e., permittivities), for instance. The different members may be different materials, the same material having different additive agents, the same material having different grades or classes, or the like. In the present embodiment, two different members include a first member that is a high dielectric-constant member that has a dielectric constant higher than a predetermined value and a second member that is a low dielectric-constant member that has a dielectric constant lower than the predetermined value.

With reference to FIG. 2, a high dielectric-constant portion 111a is formed of the high dielectric-constant member; a low dielectric-constant portion 111b is formed of the low dielectric-constant member. The high dielectric-constant portion 111a and the dielectric-constant portion 111b are layered and laminated in the plate thickness direction of the touch plate 111. The touch plate 111 is formed of double molding or laminating of the high dielectric-constant portion 111a and the low dielectric-constant portion 111b. The dimension ratio of the high dielectric-constant portion 111a in the plate thickness direction to the plate thickness t of the touch plate 111 is A (%); the dimension ratio of the low dielectric-constant portion 111b in the plate thickness direction to the plate thickness t of the touch plate 111 is B (%).

The dimension ratios A and B are designated depending on portions of the touch plate 111 corresponding to the electrode portion 114 and the wire portion 115, respectively. The dimension ratio A is designated to be greater than the dimension ratio B to increase the dielectric constant of the portion corresponding to the electrode portion 114. With reference to the left electrode portion 114 of two electrode portions 114 in FIG. 2, the portion of the touch plate 111 corresponding to the left electrode portion 114 provides the dimension ratio B of 0% and the dimension ratio A of 100%. In contrast, the dimension ratio B is designated to be greater than the dimension ratio A to decrease the dielectric constant of the portion corresponding to the wire portion 115.

In other words, in the touch plate 111, the portion corresponding to electrode portion 114 uses a relatively thicker high dielectric-constant portion 111a within the plate thickness t. In contrast, the portion corresponding to the wire portion 115 uses a relatively thinner high dielectric-constant portion 111a that is formed to have a depressed or concave portion by cutting off the original high dielectric-constant portion 111a; the concave portion receives the low dielectric-constant portion 111b. As a result, the touch plate 111 is provided to have a uniform plate thickness t over the whole of the touch plate 111.

The high dielectric-constant portion 111a is formed of polycarbonate resin material, acrylic resin material, or the like. The low dielectric-constant portion 111b is formed of polycarbonate resin material, acrylic resin material, ABS resin material, or the like. Two of the high dielectric-constant portion 111a and low dielectric-constant portion 111b may use or select only a single material of either polycarbonate resin material or acrylic resin material. In such a case, to differentiate the dielectric constant into high and low ones, different agents or different amounts of agents may be added to the two, respectively.

Switch portions 111c are provided on the front side of the touch plate 111 so as to correspond to the positions of the respective electrode portions 114. The switch portions 111c are not mechanical ones, but may be formed as printed or designed portions on the touch plate 111. In short, the switch portion 111c is provided as a marker that indicates a position on the touch plate 111 which the driver touches or contacts using a finger in the finger manipulation.

The following will explain an operation of the input apparatus 100.

The driver touches an intended switch portion 111c using a finger to operate the navigation system 10. This forms a capacitor between the finger and the electrode portion 114 corresponding to the position of the switch portion 111c touched by the finger, accumulating electricity. The accumulated electricity varies the electrostatic capacity, which is outputted as a signal from the electrode portion 114 to the control circuit 120 via the wire portion 115. The control circuit 120 receives the signal, thereby instructing the display apparatus 50 to change the displayed information to the one demanded by the driver. Thus, the driver applies the finger manipulations to the switch portions 111c, thereby changing the displayed information to the intended ones in order in the display apparatus 50.

The use of two or more different members of the touch plate 111 provides a dielectric constant corresponding to the electrode portion 114 and another dielectric constant corresponding to the wire portion 115. This permits the portion of the touch plate 111 corresponding to the electrode portion 114 to have a dielectric constant necessary for a secured input through a finger manipulation. In contrast, the portion of the touch plate 111 corresponding to the wire portion 115 is permitted to have a dielectric constant reducing sensitivity, helping prevent a mis-manipulation or malfunction.

The touch plate 111 has two or more different members, but is provided to have a uniform plate thickness over the whole of the touch plate 111. This permits the rear side of the touch plate 111 to have a flat surface that the film sensor 113 bonds. The film sensor 113 may therefore undergo less wrinkles or tensional loads. In addition, the flat surface of the rear side of the touch plate 111 may secure an area for bonding with the film sensor 113 maximally, enhancing the bonding strength. Further, the touch plate 111 is provided to have a uniform plate thickness t over the whole of the touch plate 111, suppressing deformation or concavity on the touch plate 111 when molding or manufacturing. Further, strength is secured by suppressing stress concentration in the finger manipulation on the touch plate 111.

In addition, the dielectric constant varies by changing the dimension ratios A, B in the plate thickness direction of each of at least two different members layered and laminated. This facilitates the setup of the dielectric constant according to the electrode portion 114 and the wire portion 115. In contrast, a touch plate composed of a single member may need to increase a thickness for setting up the dielectric constant. Thus, unlike the touch plate of the single member, the touch panel 111 of at least two different members does not need to increase a thickness and a size of the input apparatus 100.

In specific, the portion of the touch plate 111 corresponding to the electrode portion 114 includes the high dielectric-constant portion 111a as the first member and the low dielectric-constant portion 111b as the second member such that a dimension ratio A of the first member is greater than a dimension ratio B of the second member in the plate thickness direction; and the portion of the touch plate 111 corresponding to the wire portion 115 includes the first member and the second member such that a dimension ratio B of the second member is greater than a dimension ratio A of the first member in the plate thickness direction. Therefore, the portion corresponding to the electrode portion 114 may be easily designated to have a high dielectric constant, securing the input by the finger manipulation. In addition, the portion corresponding to the wire portion 115 may be easily designated to have a dielectric constant lower than that of the portion corresponding to the electrode portion 114, reducing a sensitivity to prevent a mis-manipulation or malfunction.

In addition, the touch plate 111 composed of two or more different members may adjust transmission or non-transmission of lights to provide an external appearance or view such that a necessary portion is transparent and bright, whereas an unnecessary portion is smoked and less-visible, thereby giving the input apparatus 100 an added value.

Other Embodiments

The first embodiment provides the touch plate 111 as two layers of the high dielectric-constant portion 111a and the low dielectric-constant portion 111b. There is no need to be limited thereto. In order to obtain dielectric constants needed to the electrode portion 114 or the wire portion 115, the touch plate 111 may be composed of more than two different layers or more than two different members.

In addition, the first embodiment applies the input apparatus 100 to the navigation system 10 to operate the display apparatus 50. There is no need to be limited thereto. the input apparatus 100 may apply to an input apparatus to a vehicular air-conditioning system for operating a temperature setup, air quantity setup, or the like. There is no need to be limited to a vehicular system. The input apparatus 100 may apply to another system or apparatus such as home electronics, portable terminals, tablets, audios, televisions, game machines, ticket machines, information terminals, or the like.

In addition, the first embodiment provides the touch plate 111 as a flat plate member and the film sensor 113 bonds to the flat surface. There is no need to be limited thereto. The film sensor 113 may bond to a face that is concave to the upper side in FIG. 2, or a face that is convex to the lower side in FIG. 2.

In addition, the front side of the touch plate 111 may be provided with a concave portion or convex portion to correspond to the shape of the input manipulation portion or appearance design portion.

While the present disclosure has been described with reference to preferred embodiments thereof, it is to be understood that the disclosure is not limited to the preferred embodiments and constructions. The present disclosure is intended to cover various modification and equivalent arrangements. In addition, while the various combinations and configurations, which are preferred, other combinations and configurations, including more, less or only a single element, are also within the spirit and scope of the present disclosure.

What is claimed is:

1. An input apparatus to input an operating condition to a predetermined apparatus by using an electrostatic capacity based on a finger manipulation of a finger of a user,
the input apparatus comprising:
a touch plate having a front side touched by the finger in the finger manipulation;
a film sensor bonded to a rear side of the touch plate;
an electrode portion provided on the film sensor; and
a wire portion provided on the film sensor and connected to the electrode portion to transmit a signal outputted from the electrode portion,
the touch plate composed of a plurality of different members including at least a first member and a second member,
the plurality of different members having respective dielectric constants and being layered and laminated, respectively, in a plate thickness direction of the touch plate,
the plurality of different members having different dimension ratios in the plate thickness direction to provide different dielectric constants depending on the electrode portion and the wire portion and provide a uniform plate thickness over a whole of the touch plate.

2. The input apparatus according to claim 1, wherein:
the first member has a dielectric constant higher than a dielectric constant of the second member;
a portion of the touch plate corresponding to the electrode portion includes the first member and the second member such that a dimension ratio of the first member is greater than a dimension ratio of the second member in the plate thickness direction; and
a portion of the touch plate corresponding to the wire portion includes the first member and the second member such that a dimension ratio of the second, member is greater than a dimension ratio of the first member in the plate thickness direction.

3. An input apparatus to input an operating condition to a predetermined apparatus by varying an electrostatic capacity in response to a finger manipulation of a finger of a user,
the input apparatus comprising:
a touch plate having a front side contacted by the finger in the finger manipulation;
a film sensor bonded to a rear side of the touch plate;
an electrode portion provided on the film sensor; and
a wire portion provided on the film sensor and connected to the electrode portion to transmit a signal outputted from the electrode portion,
the touch plate composed of a plurality of different members including at least two different members,
the plurality of different members having respective dielectric constants and being layered and laminated, respectively, in a plate thickness direction of the touch plate,
the plurality of different members having different dimension ratios in the plate thickness direction, providing different dielectric constants to differentiate in sensitivity between (i) a portion of the touch plate corresponding to the electrode portion and (ii) a portion of the touch plate corresponding to the wire portion.

* * * * *